United States Patent
Hayakawa

(10) Patent No.: US 10,506,702 B2
(45) Date of Patent: Dec. 10, 2019

(54) MOUNTING STRUCTURE, METHOD FOR MANUFACTURING MOUNTING STRUCTURE, AND RADIO DEVICE

(71) Applicant: NEC Corporation, Minato-ku, Tokyo (JP)

(72) Inventor: Makoto Hayakawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/743,323

(22) PCT Filed: Jun. 14, 2016

(86) PCT No.: PCT/JP2016/002867
§ 371 (c)(1),
(2) Date: Jan. 10, 2018

(87) PCT Pub. No.: WO2017/017885
PCT Pub. Date: Feb. 2, 2017

(65) Prior Publication Data
US 2018/0206324 A1    Jul. 19, 2018

(30) Foreign Application Priority Data

Jul. 24, 2015   (JP) .................. 2015-146984

(51) Int. Cl.
*H05K 1/02* (2006.01)
*H05K 7/20* (2006.01)
(Continued)

(52) U.S. Cl.
CPC .......... *H05K 1/0204* (2013.01); *H01L 23/12* (2013.01); *H01L 23/36* (2013.01);
(Continued)

(58) Field of Classification Search
CPC ............. H05K 1/021; H05K 1/02–0204; H01L 23/12; H01L 23/36; H01L 23/3677; G06F 1/20
(Continued)

(56) References Cited

U.S. PATENT DOCUMENTS 5,097,318 A * 3/1992 Tanaka .................. H01L 23/057
257/690
5,367,434 A  11/1994 Griffin et al.
(Continued)

FOREIGN PATENT DOCUMENTS

DE    102012216148 A1   4/2014
JP    H08-46403 A       2/1996
(Continued)

OTHER PUBLICATIONS

International Search Report for PCT Application No. PCT/JP2016/002867, dated Aug. 30, 2016.
(Continued)

*Primary Examiner* — Zachary Pape

(57) ABSTRACT

Provided is a mounting structure that can bond a first heat dissipation element to a second substrate through a hole in a first substrate without using a binder such as solder, an adhesive, or the like. A mounting structure of the present disclosure includes a first substrate (10) in which a penetrating hole (11) is formed, a second substrate (20) and a first heat dissipation element (30) overlapped with both surfaces of the first substrate (10), respectively, so as to cover the penetrating hole (11), and a second heat dissipation element (40) sandwiched and attached between the second substrate (20) and the first heat dissipation element (30) inside the penetrating hole (11).

5 Claims, 9 Drawing Sheets

(51) Int. Cl.

| | | |
|---|---|---|
| *H04B 1/38* | (2015.01) | |
| *H01L 23/36* | (2006.01) | |
| *H05K 1/14* | (2006.01) | |
| *H01L 23/373* | (2006.01) | |
| *H01L 23/12* | (2006.01) | |
| *H01L 23/367* | (2006.01) | |
| *H05K 3/36* | (2006.01) | |
| *H05K 3/00* | (2006.01) | |

(52) U.S. Cl.
CPC ...... *H01L 23/3677* (2013.01); *H01L 23/3735* (2013.01); *H01L 23/3736* (2013.01); *H04B 1/38* (2013.01); *H05K 1/021* (2013.01); *H05K 7/20* (2013.01); *H05K 7/2049* (2013.01); *H05K 1/141* (2013.01); *H05K 3/0061* (2013.01); *H05K 3/368* (2013.01); *H05K 2201/049* (2013.01); *H05K 2201/09054* (2013.01); *H05K 2201/09063* (2013.01); *H05K 2201/09072* (2013.01); *H05K 2201/10416* (2013.01)

(58) Field of Classification Search
USPC ............. 361/679.46–679.54, 688–723; 165/80.1–80.3
See application file for complete search history.

(56) References Cited

U.S. PATENT DOCUMENTS

| | | | |
|---|---|---|---|
| 5,856,911 A | 1/1999 | Riley | |
| 6,219,243 B1 | 4/2001 | Ma et al. | |
| 6,580,611 B1* | 6/2003 | Vandentop | H01L 23/367 165/185 |
| 8,236,619 B2* | 8/2012 | Lin | H01L 21/486 438/122 |
| 2003/0002260 A1* | 1/2003 | Hasebe | H01L 23/142 361/720 |
| 2004/0152426 A1* | 8/2004 | Suzuki | H04B 1/0475 455/83 |
| 2005/0174740 A1* | 8/2005 | Hayakawa | H01L 23/4006 361/718 |
| 2006/0234420 A1* | 10/2006 | Yokozuka | H01L 23/3677 438/106 |
| 2007/0247855 A1* | 10/2007 | Yano | H01L 33/641 362/294 |
| 2009/0009979 A1* | 1/2009 | Mori | B23K 1/0016 361/784 |
| 2010/0025126 A1 | 2/2010 | Nakatsu et al. | |
| 2010/0148356 A1* | 6/2010 | Tamaki | H01L 23/427 257/712 |
| 2014/0119689 A1* | 5/2014 | Yabre | G02B 6/4206 385/14 |
| 2014/0262442 A1* | 9/2014 | Nomura | H05K 1/113 174/250 |
| 2014/0268587 A1* | 9/2014 | Nomura | H05K 3/284 361/728 |
| 2014/0355222 A1* | 12/2014 | Dang | H05K 1/144 361/736 |
| 2015/0144315 A1* | 5/2015 | Chen | F28F 3/12 165/168 |
| 2015/0262904 A1* | 9/2015 | Hung | H01L 23/367 257/713 |
| 2015/0319840 A1* | 11/2015 | Sanada | H01L 23/13 361/709 |
| 2015/0333712 A1* | 11/2015 | Deliwala | H03F 3/08 600/476 |
| 2017/0033076 A1* | 2/2017 | Morita | H01L 21/56 |
| 2017/0363371 A1* | 12/2017 | David | F28F 5/00 |

FOREIGN PATENT DOCUMENTS

| | | | | |
|---|---|---|---|---|
| JP | 2004-040127 A | 2/2004 | | |
| JP | 2004-173243 A | 6/2004 | | |
| JP | 2005-005629 A | 1/2005 | | |
| JP | 2005005629 A * | 1/2005 | ......... | H01L 23/3677 |
| JP | 2008-078584 A | 4/2008 | | |
| JP | 2010-035347 A | 2/2010 | | |
| WO | 00/69236 A1 | 11/2000 | | |
| WO | WO-2004112129 A1 * | 12/2004 | ......... | H01L 23/3677 |
| WO | 2006/038543 A2 | 4/2006 | | |
| WO | 2011/137355 A1 | 11/2011 | | |

OTHER PUBLICATIONS

Japanese Office Action for JP Application No. 2017-530991 dated Aug. 28, 2018 with English Translation.
Extended European Search Report for EP Application No. EP16829994.9 dated Mar. 1, 2019.

* cited by examiner

MOUNTING STRUCTURE, METHOD FOR MANUFACTURING MOUNTING STRUCTURE, AND RADIO DEVICE

This application is a National Stage Entry of PCT/JP2016/002867 filed on Jun. 14, 2016, which claims priority from Japanese Patent Application 2015-146984 filed on Jul. 24, 2015, the contents of all of which are incorporated herein by reference, in their entirety.

TECHNICAL FIELD

The present disclosure relates to a mounting structure, a method for manufacturing the mounting structure, and a radio device.

BACKGROUND ART

In recent years, a mounting structure having a sub-substrate, which is different from a motherboard, mounted on a motherboard has been proposed. For example, Patent Literature 1 discloses a mounting structure (a substrate for a dielectric filter) in which a second printed board corresponding to the sub-substrate is mounted on a first printed board corresponding to the motherboard. In the mounting structure disclosed in Patent Literature 1, the first and the second printed boards differ from each other in a dielectric constant, a substrate thickness, or a dielectric dissipation factor.

However, in the mounting structure including the sub-substrate mounted on the motherboard, when a heat generating component is mounted on the sub-substrate, there is a problem that a heat dissipation effect is low. Hereinafter, this problem will be described. FIGS. 1 and 2 are diagrams showing a configuration example of the mounting structure of related art. FIG. 1 is a perspective diagram and FIG. 2 is a cross-sectional view showing the configuration example of the mounting structure of the related art. The mounting structure shown in FIGS. 1 and 2 includes a motherboard 110, a sub-substrate 120, and a heat sink 130. The heat sink 130 is bonded to one side of the motherboard 110 over an entire surface thereof, and the sub-substrate 120 is mounted on the other side of the motherboard 110. On the sub-substrate 120, a heat generating component 140 is mounted on a surface of the sub-substrate 120 that is opposite to a surface facing the motherboard 110. The heat generating component 140 is a component that generates heat, and is, for example, a light emitting diode or the like. The heat sink 130 is made of metal such as aluminum, copper, or the like and is provided to dissipate heat generated by the heat generating component 140.
A signal pattern 111 is formed on a surface of the motherboard 110 facing the sub-substrate 120. Further, a ground pattern 112 is formed on the motherboard 110 at a position where the sub-substrate 120 is mounted. Furthermore, through holes 113 are formed in the ground pattern 112. A signal pattern 121 is formed on a surface of the sub-substrate 120 opposite to a surface facing the motherboard 110 and on side surfaces of the sub-substrate 120. Thus, the signal pattern 121 on the side surfaces of the sub-substrate 120 and the signal pattern 111 on the motherboard 110 are electrically connected to each other.

However, in the mounting structure shown in FIGS. 1 and 2, the motherboard 110 and the sub-substrate 120 are interposed in a heat dissipation path extending from the heat generating component 140 to the heat sink 130. For this reason, as thermal resistance of the heat dissipation path includes the thermal resistance of the motherboard 110 and the sub-substrate 120, it becomes very large, thereby lowering the heat dissipation effect.

As a method for enhancing the heat dissipation effect, there is, for example, a method utilizing a structure of the mounting structure (light emitting device) disclosed in Patent Literature 2. In Patent Literature 2, a packaged light emitting diode is mounted on one surface of a wiring substrate corresponding to the motherboard, and a heat dissipation plate corresponding to the heat sink is bonded to an opposite surface of the wiring substrate. Further, an insertion hole is formed in the wiring substrate, and a projection is formed on a surface of the heat dissipation plate facing the wiring substrate. This projection is inserted into the insertion hole of the wiring substrate and is bonded to a bottom surface of the package corresponding to the sub-substrate with a binder such as solder, an adhesive, or the like interposed therebetween. Therefore, a bottom surface of the package is bonded to the projection of the heat dissipation plate with no wiring substrate interposed therebetween. Thus, the wiring substrate is not interposed in the heat dissipation path extending from a light emitting diode chip inside the package to the heat dissipation plate. Accordingly, the thermal resistance of the heat dissipation path can be lowered by the thermal resistance of the wiring substrate, thereby enhancing the heat dissipation effect.

CITATION LIST

Patent Literature

Patent Literature 1: Japanese Unexamined Patent Application Publication No. H08-46403
Patent Literature 2: Japanese Unexamined Patent Application Publication No. 2008-78584

SUMMARY OF INVENTION

Technical Problem

However, in the mounting structure disclosed in Patent Literature 2, a binder such as solder, an adhesive, or the like is used to bond the projection of the heat dissipation plate to the package. Commonly, the heat dissipation plate is often made of aluminum which is inexpensive and excellent in thermal conductivity. However, when solder is used, plating (nickel, gold, silver, etc.) needs to be applied to the projection for soldering. Thus, there is a problem that the manufacturing cost of the mounting structure is increased. Moreover, when solder is used, a process for melting the solder in a reflow furnace is required. Therefore, there are problems that thermal stress is applied to the mounting structure and a manufacturing process of the mounting structure becomes complicated. When an adhesive is used, there are problems that a process for raising the temperature to a high temperature in order to cure the adhesive is required, and time to dry the adhesive is required to thereby increase a manufacturing time of the mounting structure. When a binder such as solder, an adhesive, or the like is used, there is a problem that it is difficult to repair the mounting structure.

In the mounting structure disclosed in Patent Literature 2, the surface where the projection and the package are bonded to each other is formed in an arc shape in order to expel air bubbles contained in the binder between the projection of the heat dissipation plate and the package to a gap around the projection. Therefore, a process for processing the projection into an arc shape is required. Accordingly, there is a problem that the manufacturing cost of the mounting structure is increased and the manufacturing time is also increased for this process.

As described above, in the mounting structure disclosed in Patent Literature 2, the heat dissipation plate (a first heat dissipation element) and the package (a second substrate) are bonded to each other using the binder such as the solder, adhesive, or the like through the insertion hole in the wiring substrate (a first substrate). Accordingly, there are several problems caused by using the binder.

In light of the above circumstances, an object of the present disclosure is to provide a mounting structure, a method for manufacturing the mounting structure, and a radio device that can solve any one of the above-described problems by bonding the first heat dissipation element to the second substrate through a hole in the first substrate without using a binder such as solder, an adhesive, or the like.

Solution to Problem

In one example aspect, a mounting structure includes:
a first substrate in which a penetrating hole is formed;
a second substrate and a first heat dissipation element overlapped with both surfaces of the first substrate, respectively, so as to cover the penetrating hole; and
a second heat dissipation element sandwiched and attached between the second substrate and the first heat dissipation element inside the penetrating hole.

In another example aspect, a method for manufacturing a mounting structure includes:
forming a penetrating hole in a first substrate,
overlapping a second substrate and a first heat dissipation element on both surfaces of the first substrate, respectively, so as to cover the penetrating hole, and
sandwiching and fixing a second heat dissipation element between the second substrate and the first heat dissipation element inside the penetrating hole.

A radio device including a transmission/reception circuit composed of the mounting structure.
The transmission/reception circuit includes:
a first circuit block comprising at least an RF (Radio Frequency) front end unit configured to amplify a transmission signal by a power amplifier and amplify a reception signal with low noise by a low noise amplifier; and
a second circuit block other than the first circuit block.
The first circuit block is mounted on the second substrate, and
the second circuit block is mounted on the first substrate.

Advantageous Effects of Invention

According to the above example aspects, in the mounting structure, it is possible to achieve an effect that the first heat dissipation element is bonded to the second substrate through the penetrating hole in the first substrate without using a binder such as solder, an adhesive, or the like.

DESCRIPTION OF EMBODIMENTS

Figure 1:
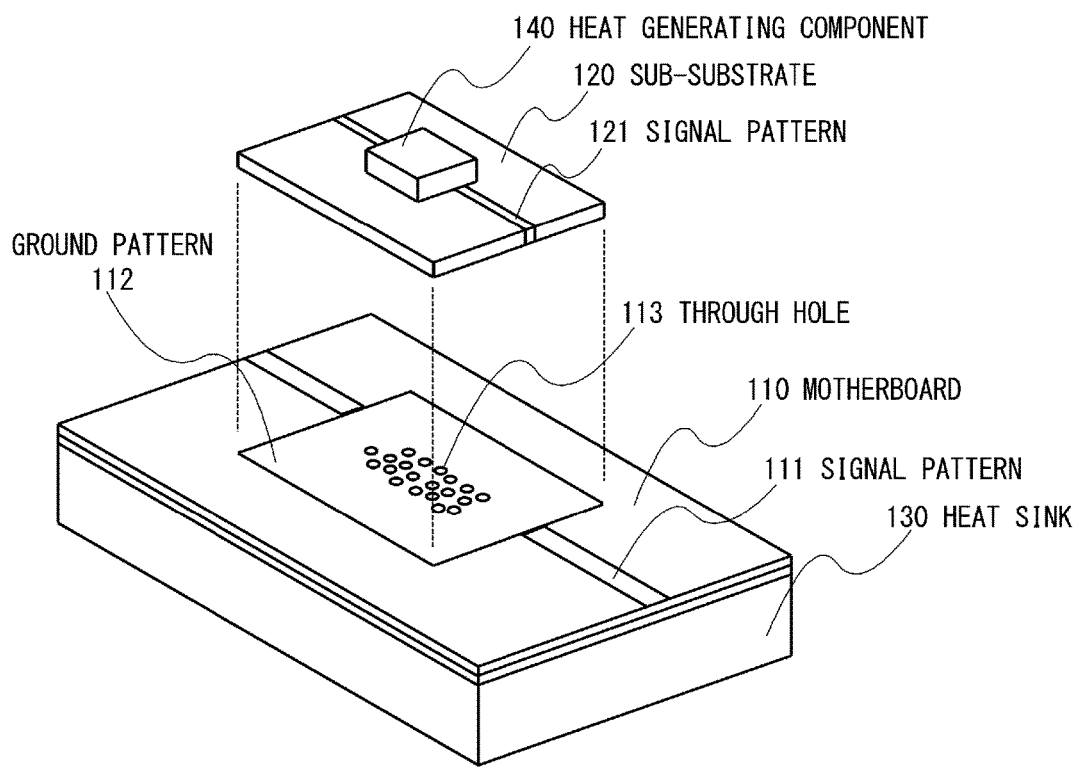
FIG. 1 is a perspective view showing a configuration example of a mounting structure of related art.
Figure 2:
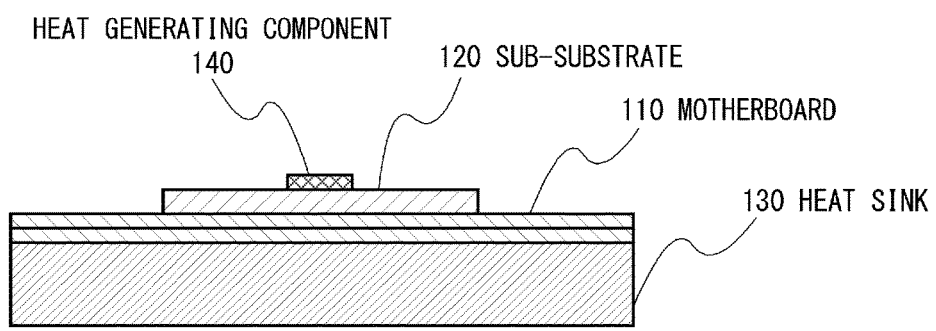
FIG. 2 is a cross-sectional view showing a configuration example of the mounting structure of the related art.
Figure 3:
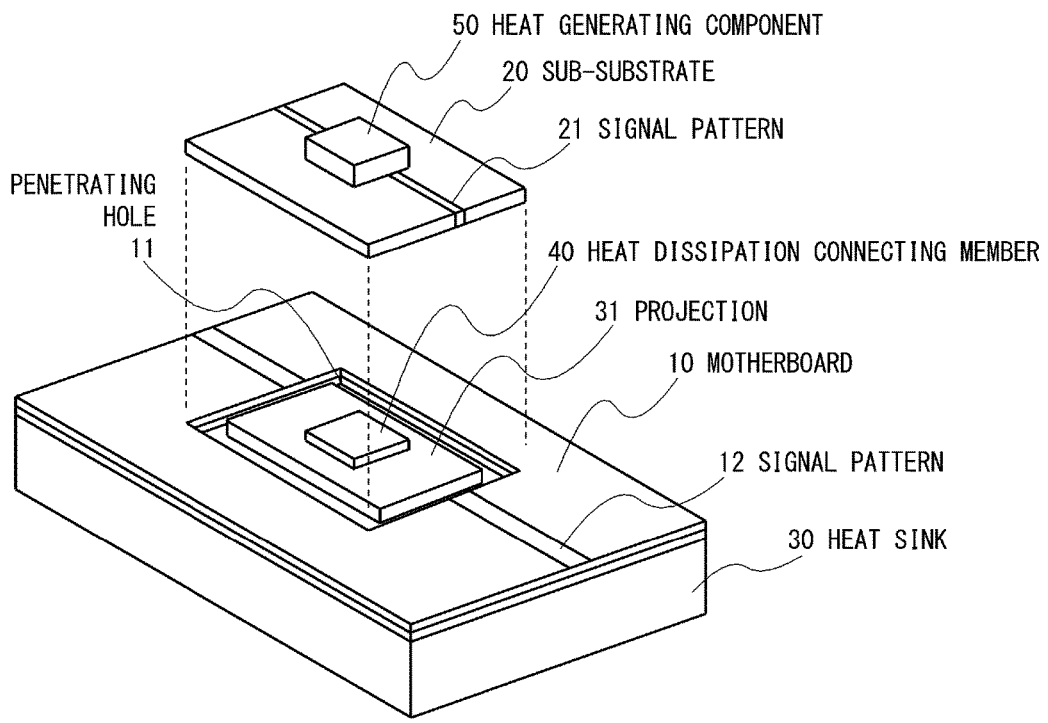
FIG. 3 is a perspective view showing a configuration example of a mounting structure of the first embodiment.
Figure 4:
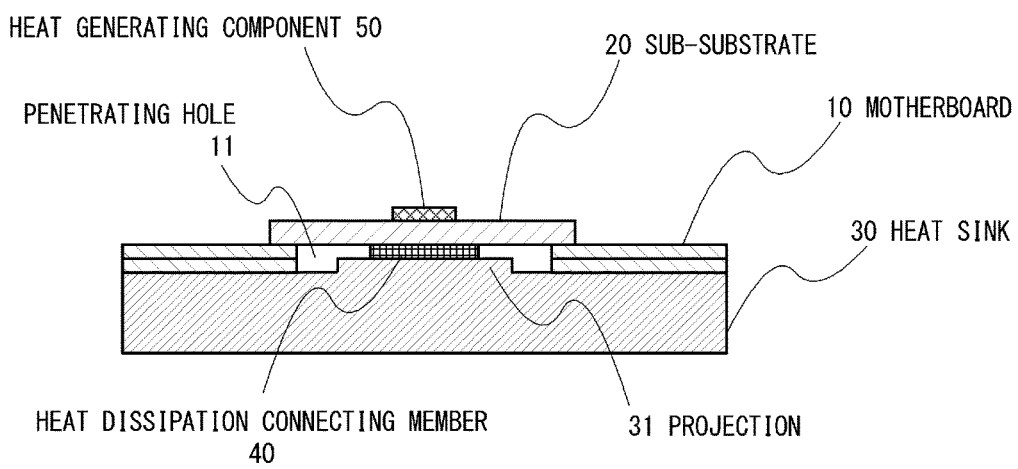
FIG. 4 is a cross-sectional view showing a configuration example of the mounting structure of the first embodiment.

Hereinafter, embodiments of the present disclosure will be described with reference to the drawings.
(1) First Embodiment
FIGS. 3 and 4 are diagrams showing a configuration example of a mounting structure according to this embodiment. FIG. 3 is a perspective view and FIG. 4 is a cross-sectional view showing the configuration example of the mounting structure according to this embodiment. The mounting structure shown in FIGS. 3 and 4 includes a motherboard 10 (a first substrate), a sub-substrate 20 (a second substrate), a heat sink 30 (a first heat dissipation element), a heat dissipation connecting member 40 (a second heat dissipation element).

A penetrating hole 11 is formed in the motherboard 10. The heat sink 30 is overlapped with one surface of the motherboard 10 so as to cover the penetrating hole 11. The sub-substrate 20 is overlapped with the other surface of the motherboard 10 so as to cover the penetrating hole 11. Note that the heat sink 30 is bonded to the motherboard 10 over the entire surface of the motherboard 10. It is assumed that the external dimensions of the sub-substrate 20 are larger than those of the penetrating hole 11 when viewed from the substrate thickness direction. It is further assumed that the sub-substrate 20 is mounted on the motherboard 10 so as to cover at least the penetrating hole 11.

On the sub-substrate 20, a heat generating component 50 is mounted on a surface of the sub-substrate 20 opposite to a surface facing the motherboard 10. The heat generating component 50 is a component that generates heat, and is, for example, a light emitting diode, an FET (Field Effect Transistor), a terminator, a circulator, an attenuator, or the like.

A signal pattern 12 is formed on a surface of the motherboard 10 facing the sub-substrate 20. A signal pattern 21 is formed on a surface of the sub-substrate 20 opposite to the surface facing the motherboard 10 and side surfaces of the sub-substrate 20. The signal pattern 21 on the side surface parts are electrically connected to the signal pattern 12 of the motherboard 10.

Figure 5:
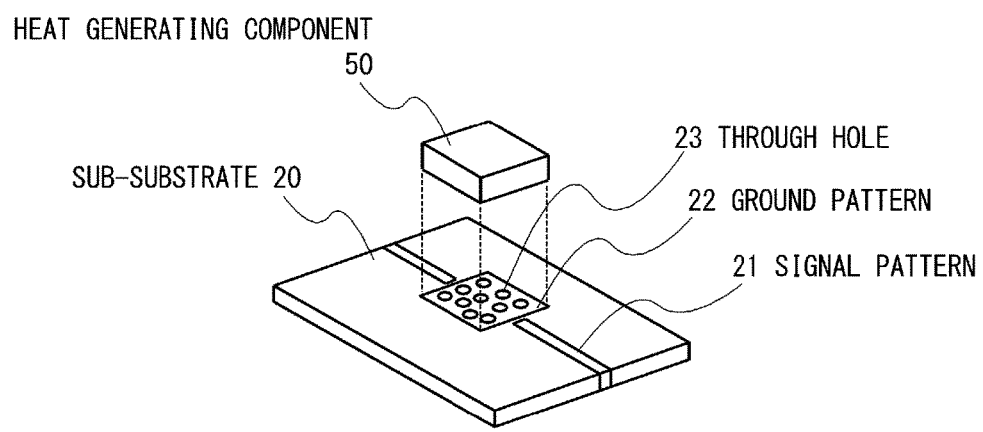
FIG. 5 is a perspective view showing an example of a wiring pattern on a surface of a sub-substrate of the mounting structure opposite to a surface facing a motherboard according to the first embodiment.
Figure 6:
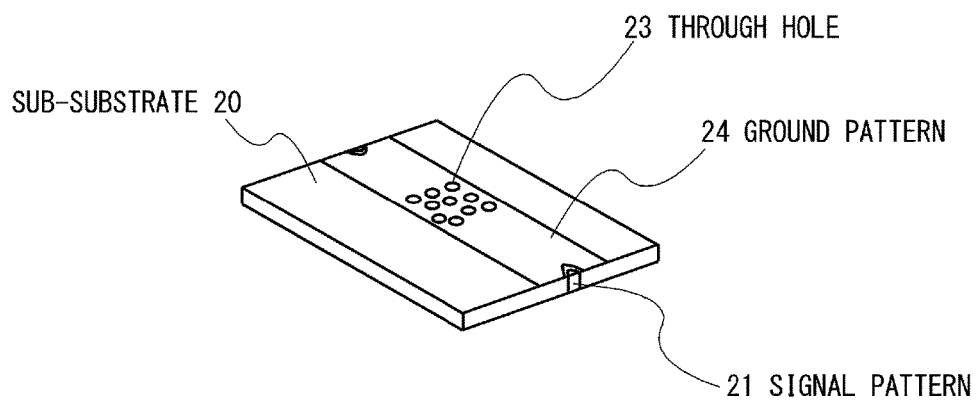
FIG. 6 is a perspective view showing an example of a wiring pattern on the sub-substrate of the mounting structure facing the motherboard according to the first embodiment.

FIGS. 5 and 6 are perspective views showing an example of a wiring pattern (including a signal pattern, a power supply pattern, a ground pattern, and the like, which are also applied to the wiring patterns in the following descriptions) of the sub-substrate 20 of the mounting structure according to this embodiment. FIG. 5 shows a wiring pattern on the surface of the sub-substrate 20 opposite to the surface facing the motherboard 10. FIG. 6 shows a wiring pattern on the surface of the sub-substrate 20 facing the motherboard 10. As shown in FIG. 5, on the surface of the sub-substrate 20 opposite to the surface facing the motherboard 10, the signal pattern 21 is formed, and in addition, a ground pattern 22 is formed at a position where the heat generating component 50 is mounted, and through holes 23 are formed in the ground pattern 22. As shown in FIG. 6, on the surface of the sub-substrate 20 facing the motherboard 10, a ground pattern 24 is formed at a position corresponding to the position of the signal pattern 21 and the position of the ground pattern 22 that are formed on the opposite surface. The through holes 23 also serve to dissipate heat generated by the heat generating component 50.

As a method for fixing the sub-substrate 20 to the motherboard 10, for example, solder, an adhesive or the like may be applied to parts where the signal pattern 12 of the motherboard 10 and the signal pattern 21 of the sub-substrate 20 are electrically connected. However, the fixing method is not limited to this.

The heat sink 30 is a heat dissipation element that is made of metal such as aluminum, copper, or the like and that dissipates the heat generated by the heat generating component 50. The heat sink 30 includes a projection 31 that is formed on a surface facing the sub-substrate 20 and is inserted into the penetrating hole 11. The external dimensions of the projection 31 are smaller than those of the penetrating hole 11 when viewed from the substrate thickness direction. Further, the size of the projection 31 in the substrate thickness direction is smaller than the substrate thickness of the motherboard 10. Therefore, the projection 31 does not protrude from the surface of the motherboard 10 facing the sub-substrate 20.

The heat dissipation connecting member 40 is a heat dissipation element for dissipating the heat generated by the heat generating component 50. The heat dissipation connecting member 40 is placed on a surface of the projection 31 facing the sub-substrate 20 at a position corresponding to a position where the heat generating component 50 is mounted. The external dimensions of the heat dissipation connecting member 40 are smaller than those of the penetrating hole 11 and the projection 31 when viewed from the substrate thickness direction. The heat dissipation connecting member 40 has elasticity in the substrate thickness direction. The dimensions of the heat dissipation connecting member 40 in the substrate thickness direction when the heat dissipation connecting member 40 is not pressed are greater than a distance between the surface of the motherboard 10 facing the sub-substrate 20 and the surface of the projection 31 facing the sub-substrate. Therefore, when the sub-substrate 20 is not mounted on the motherboard 10, the heat dissipation connecting member 40 protrudes from the surface of the sub-substrate 20 facing the motherboard 10. Accordingly, when the sub-substrate 20 is mounted on the motherboard 10, the heat dissipation connecting member 40 is brought into contact with the surface of the sub-substrate 20 facing the motherboard 10. Moreover, since the heat dissipation connecting member 40 has elasticity in the substrate thickness direction, when the sub-substrate 20 is mounted on the motherboard 10, the heat dissipation connecting member 40 is pressed toward the projection 31 by the sub-substrate 20. Eventually, the heat dissipation connecting member 40 is pressed until the sub-substrate 20 is brought into contact with the surface of the motherboard 10 facing the sub-substrate 20. As a result, inside the penetrating hole 11, the heat dissipation connecting member 40 is sandwiched and attached between the sub-substrate 20 and the projection 31. In this manner, the projection 31 of the heat sink 30 and the sub-substrate 20 are bonded to each other with the heat dissipation connecting member 40 interposed therebetween.

Figure 7:
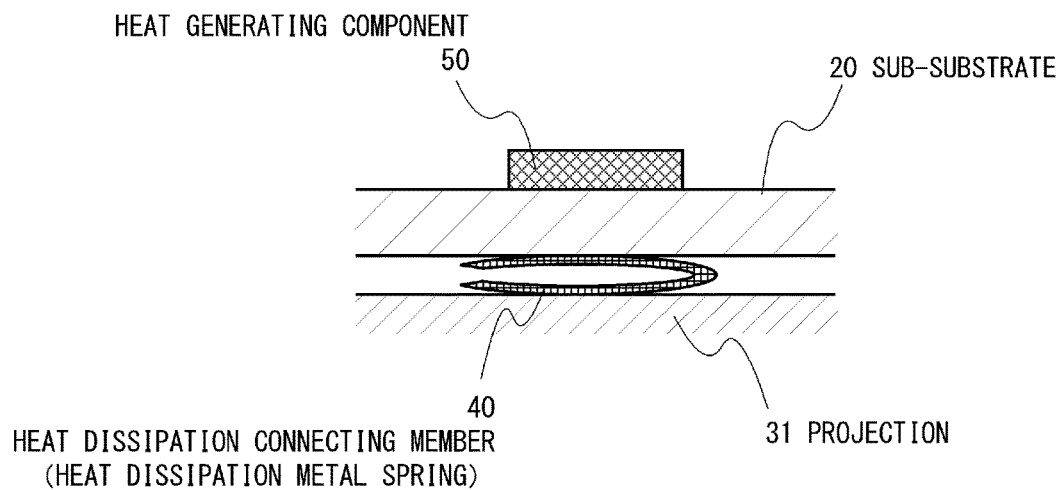
FIG. 7 is a cross-sectional view showing an example of a heat dissipation metal spring of the mounting structure according to the first embodiment.

In the example shown in FIGS. 3 and 4, the heat dissipation connecting member 40 is in the form of a sheet. As the sheet-like heat dissipation connecting member 40, a heat dissipation resin sheet, a heat dissipation metal sheet, or the like can be used. In addition, as the heat dissipation connecting member 40, heat radiation grease, a heat dissipation metal spring, or the like can be used. Examples of the heat dissipation metal sheet and the dissipation metal spring include those made of aluminum, copper, or the like. The heat dissipation metal spring can be formed in, for example, the shape shown in FIG. 7. Examples of the heat dissipation resin sheet include those having thermal conductivity of a predetermined value (e.g., 3 W/mK) or greater, which is composed of, for example, silicone or the like. Likewise, examples of the heat dissipation grease include those having thermal conductivity of a predetermined value (e.g., 3 W/mK) or greater, which is composed of, for example, silicone or the like. When the heat dissipation connecting member 40 is installed not only for heat dissipation but also for electrical contact with the sub-substrate 20, for example, one containing silver filler and having electrical conductivity may be used.

Further, as the heat dissipation connecting member 40 is sandwiched and attached between the sub-substrate 20 and the projection 31, it is considered that the movement of the heat dissipation connecting member 40 in the substrate surface direction is relatively small. However, in order to more reliably prevent the heat dissipation connecting member 40 from moving in the substrate surface direction, it is preferable to fix the heat dissipation connecting member 40 to the projection 31. As a method for fixing the heat dissipation connecting member 40 to the projection 31, for example, there may be a method for applying an adhesive or the like to a position where the heat dissipation connecting member 40 is to be fixed. However, the fixing method is not limited to this.

In this embodiment, inside the penetrating hole 11 of the motherboard 10, the heat dissipation connecting member 40 is sandwiched and attached between the projection 31 of the heat sink 30 and the sub-substrate 20. Therefore, the sub-substrate 20 is bonded to the projection 31 of the heat sink 30 without the motherboard 10 interposed therebetween. Thus, it is possible to bond the heat sink 30 and the sub-substrate 20 through the penetrating hole 11 of the motherboard 10 without using a binder such as solder, an adhesive, or the like. In addition, the motherboard 10 is not interposed in the heat dissipation path extending from the heat generating component 50 mounted on the sub-substrate 20 to the heat sink 30. Therefore, the thermal resistance of the heat dissipation path can be lowered by the thermal resistance of the motherboard 10, thereby enhancing the heat dissipation effect.

In order to bond the projection 31 of the heat sink 30 to the sub-substrate 20, the heat dissipation connecting member 40 sandwiched and attached between the projection 31 of the heat sink 30 and the sub-substrate 20 is used, and a binder such as solder, an adhesive, or the like is not used. Thus, the problem caused by the use of the binder as seen in the mounting structure of Patent Literature 2 will not occur.

Specifically, as it is not necessary to apply plating (nickel, gold, silver, etc.) to the projection 31 of the heat sink 30 for soldering, the manufacturing cost of the mounting structure can be reduced. Further, since a process for melting the solder in a reflow furnace is unnecessary, thermal stress is not applied to the mounting structure, and the manufacturing process of the mounting structure can be simplified. Moreover, a process for raising the temperature to a high temperature in order to cure the adhesive becomes unnecessary, and time to dry the adhesive also becomes unnecessary. In addition, the heat dissipation connecting member 40 sandwiched and attached between the projection 31 of the heat sink 30 and the sub-substrate 20 is used to bond the projection 31 of the heat sink 30 to the sub-substrate 20, and a binder such as solder, an adhesive, or the like is not used. Accordingly, the mounting structure can be easily repaired.

Furthermore, unlike Patent Literature 2, the shape of the projection 31 of the heat sink 30 does not has to be shaped in an arc shape. Hence, as the process for shaping the projection 31 in an arc shape becomes unnecessary, the manufacturing cost and the manufacturing time of the mounting structure can be reduced.

Figure 8:
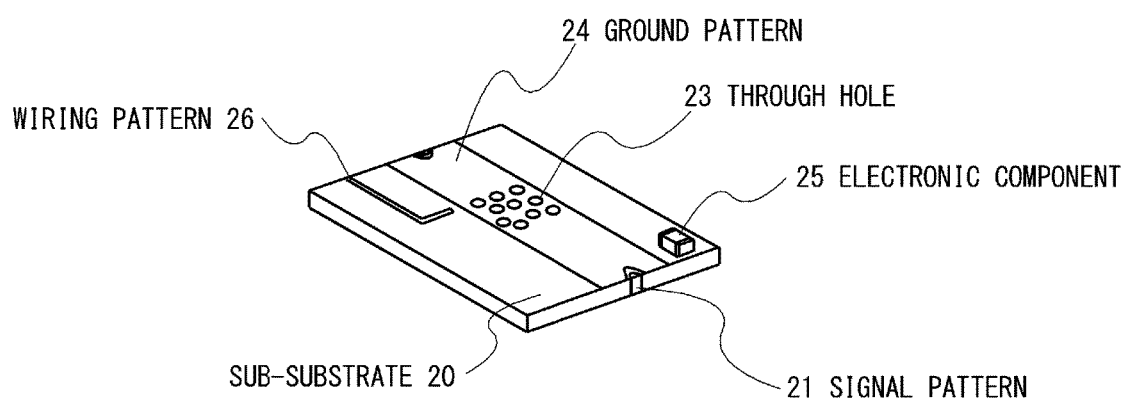
FIG. 8 is a perspective view showing an implementation example of a region corresponding to a gap of the sub-substrate of the mounting structure according to the first embodiment.
Figure 9:
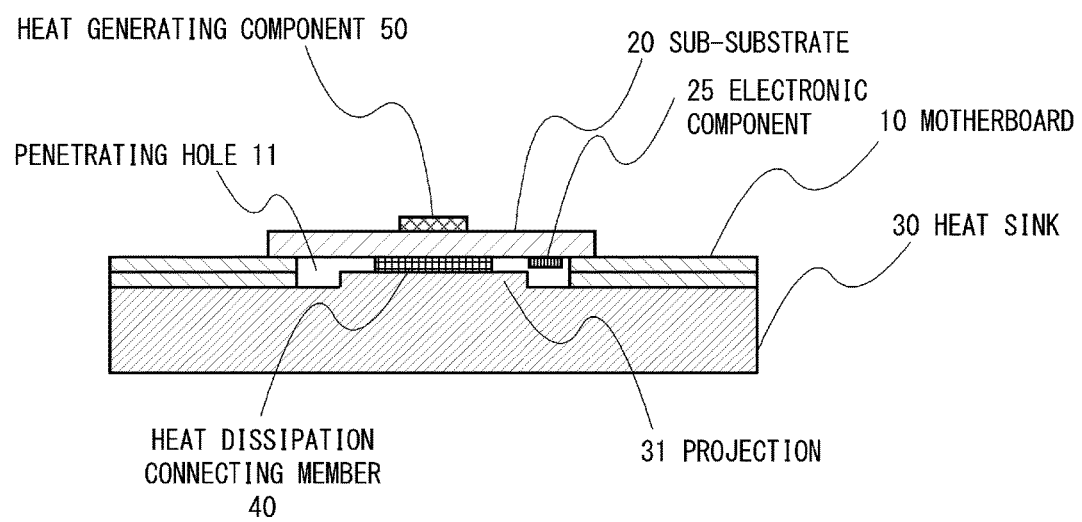
FIG. 9 is a cross-sectional view showing an implementation example of the region corresponding to the gap of the sub-substrate of the mounting structure according to the first embodiment.

As the external dimensions of the projection 31 inserted into the penetrating hole 11 of the motherboard 10 are smaller than those of the penetrating hole 11 when viewed from the substrate thickness direction, a gap is formed inside the penetrating hole 11. As shown in FIG. 6, the ground pattern 22 needs to be formed in a part of an area corresponding to the gap on the surface of the sub-substrate 20 facing the motherboard 10. The rest of the area is a vacant area. Therefore, as shown in FIGS. 8 and 9, it is possible to mount an electronic component 25 in the vacant area in the gap or wire a wiring pattern 26 in the vacant area in the gap. Note that FIG. 8 shows the surface of the sub-substrate 20 facing the motherboard 10.

Figure 10:
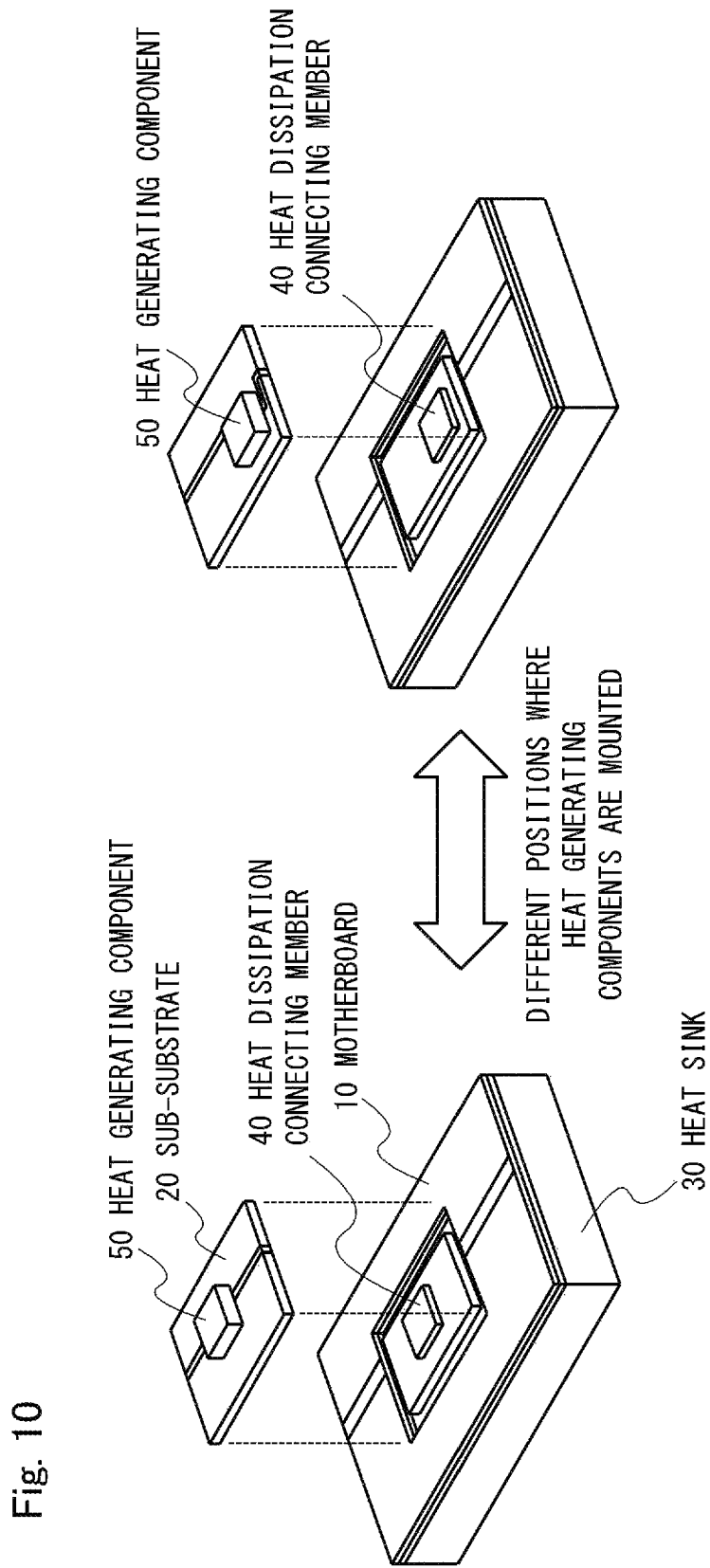
FIG. 10 is a perspective view showing a configuration example of the mounting structure when a heat generating component is mounted on another position according to the first embodiment.

The heat dissipation connecting member 40 sandwiched and attached between the projection 31 of the heat sink 30 and the sub-substrate 20 is used to bond the projection 31 of the heat sink 30 to the sub-substrate 20. Therefore, as shown in FIG. 10, when a position where the heat generating component 50 is mounted on the sub-substrate 20 is different from the above example, the heat dissipation effect can be maintained only by changing the position where the heat dissipation connecting member 40 is placed to a position corresponding to the position where the heat generating component 50 is mounted. In this way, it is possible to respond flexibly to changes in the positions where the heat generating component 50 is mounted. Moreover, since the position where the heat generating component 50 is mounted is not particularly limited, the flexibility in implementation is improved.

(2) Second Embodiment

Figure 11:
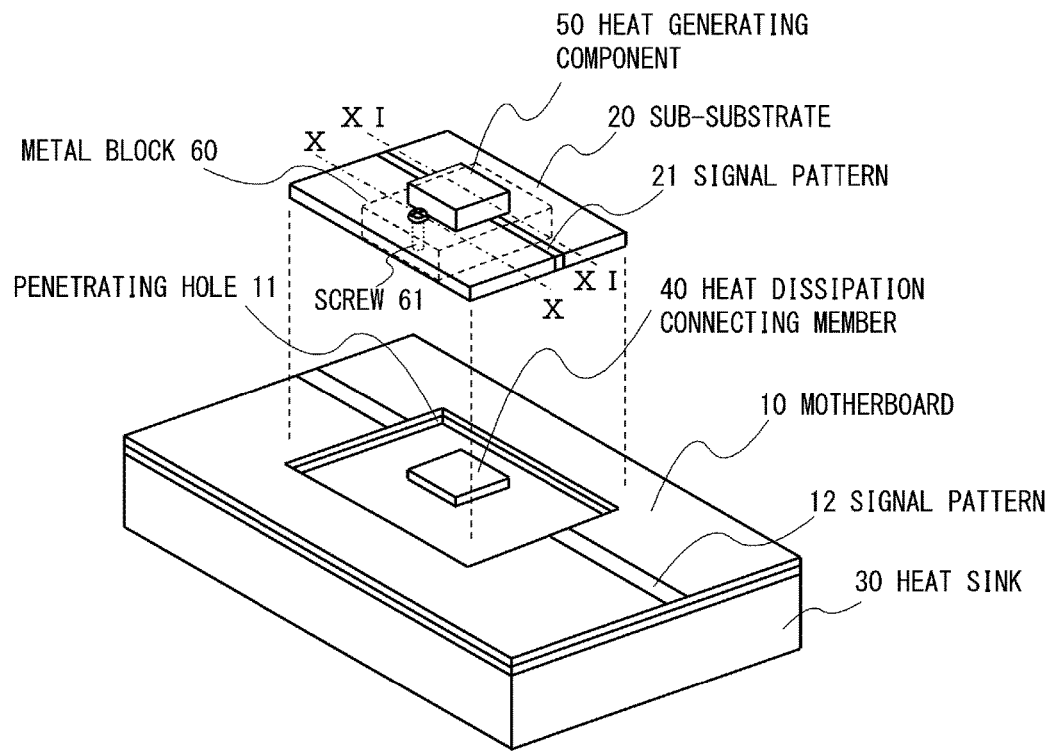
FIG. 11 is a perspective view showing a configuration example of a mounting structure according to a second embodiment.
Figure 12:
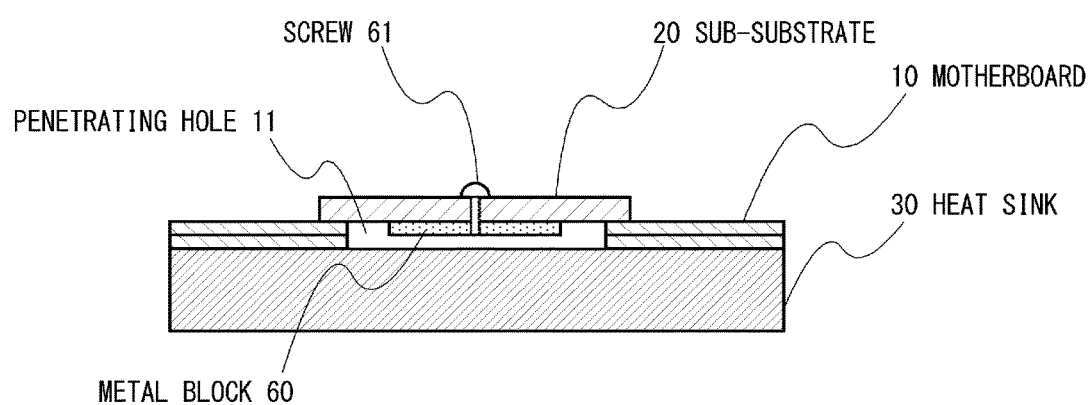
FIG. 12 is a cross-sectional view showing a configuration example of the mounting structure according to the second embodiment.
Figure 13:
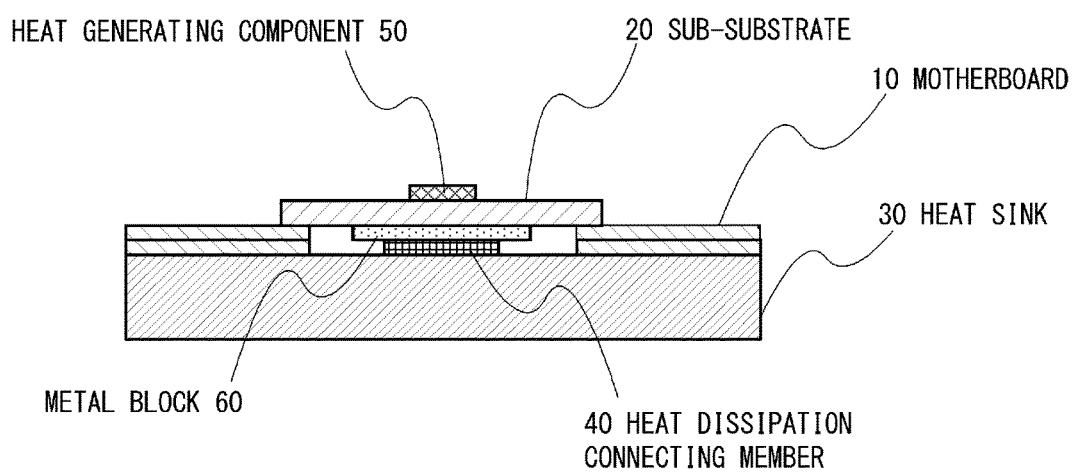
FIG. 13 is a cross-sectional view showing a configuration example of the mounting structure according to the second embodiment.

FIGS. 11 to 13 are diagrams showing a configuration example of a mounting structure of this embodiment. FIG. 11 is a perspective view showing the configuration example of the mounting structure of this embodiment. FIG. 12 is a cross-sectional view taken along the line X-X of FIG. 11. FIG. 13 is a cross-sectional view taken along the line XI-XI of FIG. 11. The mounting structure shown in FIGS. 11 to 13 differs from the mounting structure of the first embodiment in the following point. Specifically, in the mounting structure shown in FIGS. 11 to 13, a metal block 60 (a third heat dissipation element) is bonded to the surface of the sub-substrate 20 facing the motherboard 10, and the projection 31 of the heat sink 30 is removed instead.

The metal block 60 is a plate-like heat dissipation element made of metal such as aluminum, copper, or the like for dissipating the heat generated by the heat generating component 50. The metal block 60 is disposed on the surface of the sub-substrate 20 facing the motherboard 10 at a position corresponding to the position where the heat generating component 50 is mounted. The external dimensions of the metal block 60 are smaller than those of the penetrating hole 11 when viewed from the substrate thickness direction. Thus, when the sub-substrate 20 is mounted on the motherboard 10, the metal block 60 is inserted into the penetrating hole 11 of the motherboard 10. Further, the dimensions of the metal block 60 in the substrate thickness direction are smaller than the substrate thickness of the motherboard 10. Therefore, even when the sub-substrate 20 is mounted on the motherboard 10, the metal block 60 does not protrude from the surface of the motherboard 10 facing the heat sink 30. In the example shown in FIGS. 11 to 13, the metal block 60 is screwed and bonded to the sub-substrate 20 by a screw 61. However, the present disclosure is not limited to this. The metal block 60 may be bonded to the sub-substrate 20 by an adhesive or the like.

The heat dissipation connecting member 40 is substantially the same as that of the first embodiment. Only the configurations of the second embodiment different from that of the first embodiment will be described below. The heat dissipation connecting member 40 is placed on the surface of the heat sink 30 facing the sub-substrate 20 at a position corresponding to a position where the penetrating hole 11 is formed and a position where the heat generating component 50 is mounted. In addition, the external dimensions of the heat dissipation connecting member 40 are smaller than those of the penetrating hole 11 and the metal block 60 when viewed from the substrate thickness direction. The dimensions of the heat radiation connecting member 40 in the substrate thickness direction of the heat dissipation connecting member 40 when the heat dissipation connecting member 40 is not pressed are greater than a distance between the surface of the metal block 60 facing the heat sink 30 and the surface of the heat sink 30 facing the sub-substrate 20 when the sub-substrate 20 is mounted on the motherboard 10. Therefore, when the sub-substrate 20 is mounted on the motherboard 10, the heat dissipation connecting member 40 is brought into contact with the surface of the metal block 60 facing the heat sink 30. In addition, as the heat dissipation connecting member 40 has elasticity in the substrate thickness direction, when the sub-substrate 20 is mounted on the motherboard 10, the heat dissipation connecting member 40 is pressed toward the heat sink 30 by the metal block 60 bonded to the sub-substrate 20. Eventually, the heat dissipation connecting member 40 is pressed until the sub-substrate 20 is brought into contact with the surface of the motherboard 10 facing the sub-substrate 20. As a result, inside the penetrating hole 11, the heat dissipation connecting member 40 is sandwiched and attached between the sub-substrate 20 and the heat sink 30 with the metal block 60 bonded to the sub-substrate 20 interposed therebetween. In this manner, the heat sink 30 and the sub-substrate 20 are bonded to each other with the heat dissipation connecting member 40 and the metal block 60 interposed therebetween.

In this embodiment, inside the penetrating hole 11 of the motherboard 10, the heat dissipation connecting member 40 is sandwiched and attached between the sub-substrate 20 and the heat sink 30 with the metal block 60 bonded to the sub-substrate 20 interposed therebetween. Accordingly, the sub-substrate 20 is bonded to the heat sink 30 with the metal block 60 interposed therebetween and without the motherboard 10 interposed therebetween. Thus, it is possible to bond the heat sink 30 to the sub-substrate 20 through the penetrating hole 11 of the motherboard 10 without using a binder such as solder, an adhesive, or the like. Further, the motherboard 10 is not interposed in the heat dissipation path extending from the heat generating component 50 mounted on the sub-substrate 20 to the heat sink 30. Therefore, the thermal resistance of the heat dissipation path can be lowered by the thermal resistance of the motherboard 10, thereby enhancing the heat dissipation effect. The metal block 60 has very high thermal conductivity, and the metal block 60 is disposed at a position closer to the heat generating component 50. Thus, the heat dissipation effect can be further enhanced as compared to the first embodiment.

Further, in this embodiment, as in the first embodiment, in order to bond the projection 31 of the heat sink 30 to the sub-substrate 20, the heat dissipation connecting member 40 sandwiched and attached between the projection 31 of the heat sink 30 and the sub-substrate 20 is used, and a binder such as solder, an adhesive, or the like is not used. Furthermore, the gap is formed inside the penetrating hole 11. Accordingly, in this embodiment, in addition to the above-described effects, the same effects as those of the first embodiment can be achieved.

(3) Third Embodiment

Figure 14:
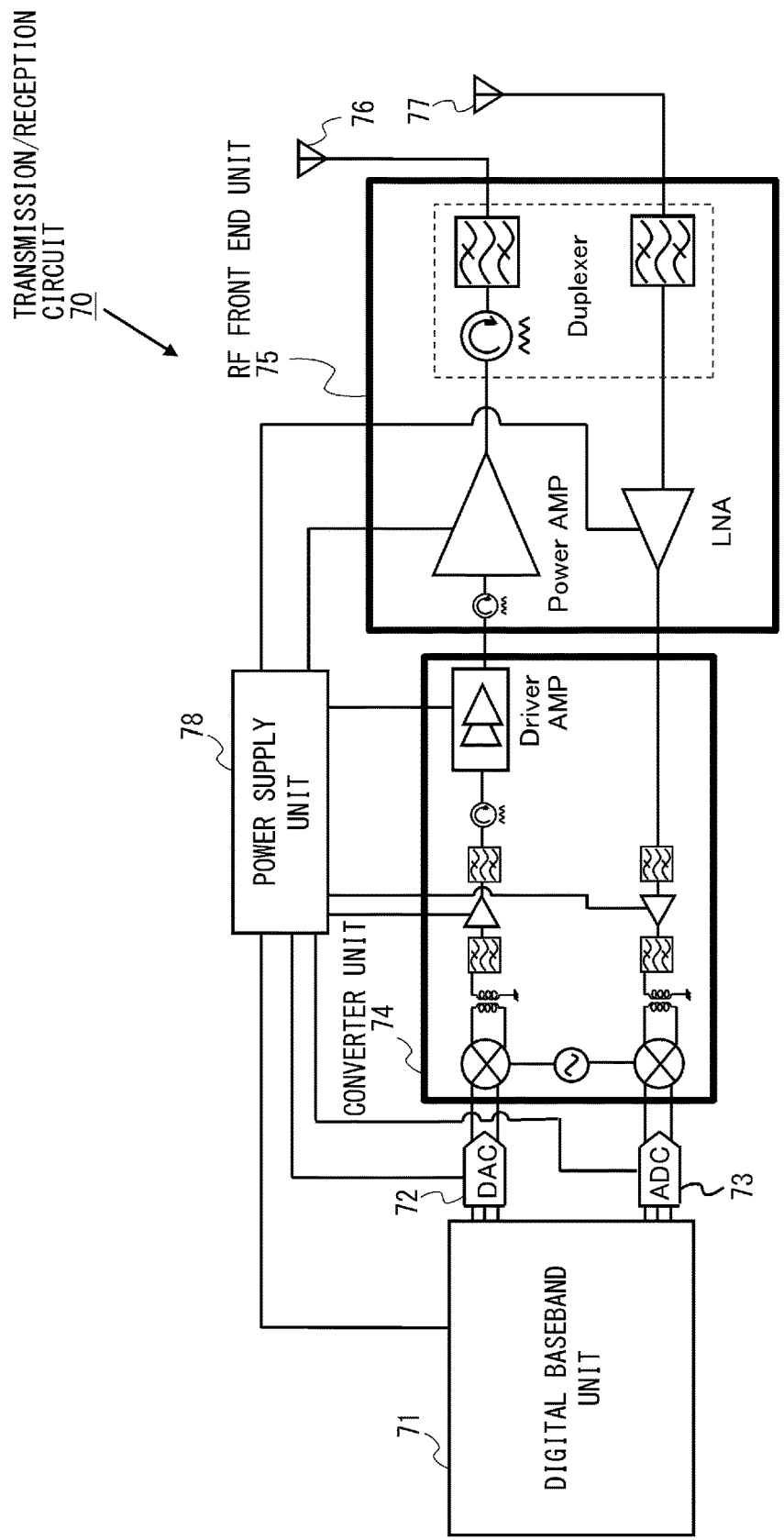
FIG. 14 is a circuit diagram showing a configuration example of a transmission/reception circuit of a radio device according to a third embodiment.

This embodiment is about an example of a radio device using the mounting structure of the first or second embodiment. Specifically, this embodiment is about an example in which a transmission/reception circuit included in the radio device is composed of the mounting structure of the first or second embodiment. FIG. 14 is a circuit diagram showing a configuration example of the transmission/reception circuit of the radio device according to this embodiment. A transmission/reception circuit 70 shown in FIG. 14 includes a Digital Baseband unit 71, a DAC (Digital to Analog Converter) 72, an ADC (Analog to Digital Converter) 73, a converter unit 74, a Radio Frequency (RF) front end unit 75, a transmission antenna 76, a reception antenna 77, and a power supply unit 78.

The digital baseband unit 71 is a circuit block that is composed of an FPGA (Field Programmable Gate Array), a DSP (Digital Signal Processor), and the like and that performs digital signal processing on a transmission signal and a reception signal.

The DAC 72 converts the transmission signal from a digital signal to an analog signal.

The ADC 73 converts the reception signal from an analog signal to a digital signal.

The converter unit 74 is a circuit block that includes a mixer, a VCO (Voltage Controlled Oscillator), a filter, and the like and that converts a transmission signal from a low frequency signal to a high frequency (Radio Frequency (RF)) signal and converts a reception signal from a high frequency signal to a low frequency signal.

The RF front end unit 75 is a circuit block that includes a power amplifier (Power AMP (amplifier)), an LNA (Low Noise Amplifier), a duplexer, and the like and that amplifies a transmission signal by the power amplifier, transmits it from the transmission antenna 76, and amplifies, by the LNA, a weak reception signal received by the reception antenna 77 with low noise.

The power supply unit 78 supplies DC power to an active device in each circuit block of the digital baseband unit 71, the converter unit 74, and the RF front end unit 75, and the DAC 72 and the ADC 73.

First, in the digital baseband unit 71, the transmission signal is subjected to digital signal processing such as digital modulation and digital pre-distortion. Next, in the DAC 72, the transmission signal is converted from a digital signal to an analog signal. Next, in the converter unit 74, the transmission signal is converted from a low frequency signal of about several hundred MHz to a desired high frequency signal. Next, in the RF front end unit 75, the transmission signal is amplified to a desired power level by the power amplifier, and unnecessary frequency components are removed by the duplexer. After that, the transmission signal is transmitted from the transmission antenna 76.

On the other hand, the weak reception signal received by the reception antenna 77 is amplified with low noise by the LNA in the RF front end unit 75, and converted from the high frequency signal into a low frequency signal of about several 100 MHz in the converter unit 74. Then, in the ADC 73, the reception signal is converted from an analog signal to a digital signal. After that, the reception signal is subjected to digital signal processing such as digital demodulation and the like in the digital baseband unit 71.

Incidentally, in the RF front end unit 75, it is necessary to transmit the transmission signal amplified to the desired power level by the power amplifier to the transmission antenna 76 without loss. Suppose that the loss of the transmission signal between the power amplifier and the transmission antenna 76 is large. In this case, since a transmission power level of the transmission antenna 76 is determined, it is necessary for the power amplifier to amplify the transmission signal to a higher power level in order to compensate for the loss. However, in order to amplify the transmission signal to a higher power level, it is necessary to use a large power amplification element (bipolar transistor, FET) for the power amplifier and to supply large DC power from the power supply unit 78 to the power amplifier. Consequently, an increase in the power consumption and the size of the radio device is unavoidable. Furthermore, in the case of a high-power radio device, the substrate generates heat when the transmission signal amplified by the power amplifier is lost in the substrate, and in the worst case, the substrate could be burned out. Therefore, it is necessary for the RF front end unit 75 to have a low loss.

Further, the converter unit 74 and the RF front end unit 75 process the high frequency signal, but a frequency band of the high frequency signal is determined according to a frequency menu. For this reason, the converter unit 74 and the RF front end unit 75 have frequency dependence. On the other hand, other circuits including the digital baseband unit 71, the power supply unit 78, and the like have no frequency dependence.

As described so far, in the transmission/reception circuit 70 shown in FIG. 14, the RF front end unit 75 is a circuit block that has frequency dependence and requires low loss. Further, the converter unit 74 is a circuit block that has frequency dependence. On the other hand, the other circuits including the digital baseband unit 71, the power supply unit 78, and the like are circuit blocks that do not have frequency dependence and do not need low loss.

When all the circuits of the transmission/reception circuit 70 can be formed on an integrated substrate, parts such as cables and connectors connecting the substrates become unnecessary, and thus not only can the radio device be realized inexpensively and compactly, but also assembling becomes easy.

However, when circuit blocks having frequency dependence such as the converter unit 74 and the RF front end unit 75 are formed on an integrated substrate, it is necessary to redesign the substrate for all the circuit areas of the transmission/reception circuit 70 every time the frequency menu is changed.

Moreover, as a substrate for the digital baseband unit 71, an FR4 (Flame Retardant Type 4) substrate is commonly used. The tan δ (dielectric dissipation factor) of the FR4 substrate is about 0.02. For example, at a frequency of 5 GHz, a loss of about 0.03 dB/mm occurs. On the other hand, the tan δ of an expensive but low loss PTFE (polytetrafluoroethylene) substrate is about 0.0002, the loss at a frequency of 5 GHz is about 0.002 dB/mm, which is less than 1/10 of that of the FR4 substrate. The higher the frequency, the greater a difference in the losses between the two substrates. Therefore, for a circuit block requiring low loss such as the RF front end unit 75, it is highly necessary to use a substrate with low loss, even if it is expensive. However, when all the circuits of the transmission/reception circuit 70 are integrally formed on a low-loss substrate, the circuit areas such as the digital baseband unit 71 and the power supply unit 78, which do not need to be low loss, are also formed of expensive and low loss substrates. This will lead to an increase in the manufacturing cost of the radio device. Moreover, since the digital baseband unit 71 has many wiring lines and requires a multilayer substrate, a large number of low loss substrates are required. Thus, the manufacturing cost of the radio device is further increased.

Therefore, in this embodiment, a circuit block (a first circuit block) of the converter unit 74 and the RF front end unit 75 having frequency dependence is mounted on the sub-substrate 20, and the sub-substrate 20 is formed of an expensive but low loss substrate such as a PTFE substrate. On the other hand, another circuit block (a second circuit block including the digital baseband unit 71, the power supply unit 78, and the like) having no frequency dependence other than the converter unit 74 and the RF front end unit 75 is mounted on the motherboard 10. The motherboard 10 is formed of an inexpensive substrate such as an FR4 substrate.

In this way, only the sub-substrate 20 can be formed of a low-loss substrate and the motherboard 10 can be formed of an inexpensive substrate. It is thus possible to reduce the number of the low-loss substrates, and consequently, the manufacturing cost of the radio device can be reduced. Moreover, as the sub-substrate 20 is formed of a low-loss substrate, the RF front end unit 75 mounted on the sub-substrate 20 can be low loss. Additionally, even when the frequency menu is changed, it is necessary to redesign the substrate only for the circuit area of the converter unit 74 and the RF front end unit 75 mounted on the sub-substrate 20. Thus, the substrate design becomes easy.

Furthermore, when the frequency menus are different between the radio devices, only the sub-substrate 20 may be changed according to the frequency menu, and the common motherboard 10 can be used. It is thus possible to further reduce the manufacturing cost of the radio device.

Although the present disclosure has been described with reference to the embodiments, the present disclosure is not limited by the above descriptions. Various changes that can be understood by those skilled in the art within the scope of the invention can be made to the configuration and details of the present disclosure.

For example, in the first and second embodiments, an example is described in which one heat generating component 50 is mounted on the sub-substrate 20. However, the present disclosure can be applied to a case where a plurality of the heat generating components 50 are mounted on the sub-substrate 20. In this case, the same number of heat dissipation connecting members 40 as that of the heat generating components 50 may be provided, and the heat dissipation connecting members 40 may be disposed, inside the penetrating hole 11 of the motherboard 10, at respective positions corresponding to positions where the plurality of heat generating components 50 are mounted. In the case of the second embodiment, the same number of metal blocks 60 as that of the heat generating components 50 may be provided, and the metal blocks 60 may be disposed on the surface of the sub-substrate 20 facing the motherboard 10 at respective positions corresponding to the positions where the plurality of heat generating components 50 are mounted.

Further, in the first and second embodiments, an example is described in which one sub-substrate 20 is mounted on the motherboard 10. However, the present disclosure can be applied to a case where a plurality of sub-substrates 20 are mounted on the motherboard 10. In this case, the same number of penetrating holes 11 as that of the sub-substrates 20 may be formed in the motherboard 10, and the plurality of sub-substrates 20 may be overlapped with the motherboard 10 so as to cover the plurality of penetrating holes 11. Further, the heat sink 30 may be overlapped with the motherboard 10 so as to cover all of the plurality of penetrating holes 11. Furthermore, the same number of heat dissipation connecting members 40 as that of the heat generating components 50 may be provided, and, inside the corresponding penetrating holes 11 of the motherboard 10, the heat dissipation connecting members 40 may be disposed at respective positions corresponding to positions where the plurality of heat generating components 50 are mounted. In the case of the second embodiment, the same number of metal blocks 60 as that of the heat generating components 50 may be provided, and the metal blocks 60 may be disposed on the surface of the corresponding sub-substrates 20 facing the motherboard 10 at positions corresponding to positions where the plurality of heat generating components 50 are mounted.

In the third embodiment, the converter unit 74 and the RF front end unit 75 are mounted on the sub-substrate 20 formed of a low-loss substrate. However, the present disclosure is not limited to this. Of the converter unit 74 and the RF front end unit 75, only the RF front end unit 75 is a circuit block that requires low loss. Therefore, only the RF front end unit 75 requiring low loss may be mounted on the sub-substrate 20 formed of a low loss substrate. In this case, the converter unit 74 may be mounted on the motherboard 10. However, since the converter unit 74 has frequency dependence, it is preferable to mount the converter unit 74 on another sub-substrate 20 from the viewpoint of using the common motherboard 10. In this case, the other sub-substrate 20 on which the converter unit 74 is mounted does not need to be a low-loss substrate and can be formed by an inexpensive substrate.

The present application is based upon and claims the benefit of priority from Japanese Patent Application No.

2015-146984, filed on Jul. 24, 2015, the entire contents of which are hereby incorporated by reference.

REFERENCE SIGNS LIST

10 MOTHERBOARD
11 PENETRATING HOLE
12 SIGNAL PATTERN
20 SUB-SUBSTRATE
21 SIGNAL PATTERN
22 GROUND PATTERN
23 THROUGH HOLE
24 GROUND PATTERN
25 ELECTRONIC COMPONENT
26 WIRING PATTERN
30 HEAT SINK
31 PROJECTION
40 HEAT DISSIPATION CONNECTING MEMBER
50 HEAT GENERATING COMPONENT
60 METAL BLOCK
61 SCREW
70 TRANSMISSION/RECEPTION CIRCUIT
71 DIGITAL BASEBAND UNIT
72 DAC
73 ADC
74 CONVERTER UNIT
75 RF FRONT END UNIT
76 TRANSMISSION ANTENNA
77 RECEPTION ANTENNA
78 POWER SUPPLY UNIT

What is claimed is:

1. A mounting structure comprising:
   a first substrate in which a penetrating hole is formed;
   a second substrate and a first heat dissipation element overlapped with both surfaces of the first substrate, respectively, so as to cover the penetrating hole; and
   a second heat dissipation element sandwiched and attached between the second substrate and the first heat dissipation element inside the penetrating hole,
   wherein the second heat dissipation element is a metal spring having elasticity in the first substrate thickness direction,
   wherein, inside the penetrating hole, the second heat dissipation element is disposed at a position corresponding to a position where a heat generating component is mounted, the heat generating component being mounted on a surface of the second substrate opposite to a surface facing the first substrate,
   wherein the first heat dissipation element includes a projection formed on a surface of the first heat dissipation element facing the second substrate and inserted into the penetrating hole, and inside the penetrating hole, the second heat dissipation element is sandwiched and attached between the second substrate and the projection of the first heat dissipation element,
   wherein the projection has a size in the first substrate thickness direction that is smaller than the substrate thickness of the first substrate and does not protrude from the surface of the first substrate that faces the second substrate,
   wherein when the second substrate is not mounted on the first substrate, the second heat dissipation element protrudes from the surface of the first substrate that faces the second substrate, and
   wherein when the second substrate is mounted on the first substrate, the second heat dissipation element is brought in contact with and pressed against the surface of the second substrate that faces the first substrate.

2. The mounting structure according to claim 1, wherein the heat generating component is one of a plurality of heat generating components mounted on the second substrate, and
   inside the penetrating hole, additional second heat dissipation elements are disposed at respective positions corresponding to positions where the plurality of the heat generating components are mounted.

3. A radio device comprising a transmission/reception circuit composed of the mounting structure according to claim 1, wherein
   the transmission/reception circuit comprises:
      a first circuit block comprising at least an RF (Radio Frequency) front end unit configured to amplify a transmission signal by a power amplifier and amplify a reception signal with low noise by a low noise amplifier; and
      a second circuit block other than the first circuit block, wherein
      the first circuit block is mounted on the second substrate, and
      the second circuit block is mounted on the first substrate.

4. The radio device according to claim 3, wherein the first circuit block further comprises a converter unit configured to convert the transmission signal from a low frequency signal to a high frequency signal, output the transmission signal to the RF front end unit, convert the reception signal output from the RF front end unit from a high frequency signal to a low frequency signal.

5. A method for manufacturing a mounting structure comprising:
   forming a penetrating hole in a first substrate,
   overlapping a second substrate and a first heat dissipation element on both surfaces of the first substrate, respectively, so as to cover the penetrating hole, and
   sandwiching and attaching a second heat dissipation element between the second substrate and the first heat dissipation element inside the penetrating hole,
   wherein the second heat dissipation element is a metal spring having elasticity in the first substrate thickness direction,
   wherein, inside the penetrating hole, the second heat dissipation element is disposed at a position corresponding to a position where a heat generating component is mounted, the heat generating component being mounted on a surface of the second substrate opposite to a surface facing the first substrate,
   wherein the first heat dissipation element includes a projection formed on a surface of the first heat dissipation element facing the second substrate and inserted into the penetrating hole, and inside the penetrating hole, the second heat dissipation element is sandwiched and attached between the second substrate and the projection of the first heat dissipation element,
   wherein the projection has a size in the first substrate thickness direction that is smaller than the substrate thickness of the first substrate and does not protrude from the surface of the first substrate that faces the second substrate,
   wherein when the second substrate is not mounted on the first substrate, the second heat dissipation element protrudes from the surface of the first substrate that faces the second substrate, and wherein when the second substrate is mounted on the first substrate, the second heat dissipation element is brought in contact with and pressed against the surface of the second substrate that faces the first substrate.

\* \* \* \* \*